United States Patent
Yamashita et al.

(10) Patent No.: US 12,166,324 B2
(45) Date of Patent: Dec. 10, 2024

(54) CONNECTED STRUCTURE OF SUBSTRATE AND CARBON NANOTUBE WIRE

(71) Applicant: Furukawa Electric Co., Ltd., Tokyo (JP)

(72) Inventors: Satoshi Yamashita, Tokyo (JP); Kenji Hatamoto, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 308 days.

(21) Appl. No.: 17/485,172

(22) Filed: Sep. 24, 2021

(65) Prior Publication Data

US 2022/0013927 A1 Jan. 13, 2022

Related U.S. Application Data

(63) Continuation of application No. PCT/JP2020/013911, filed on Mar. 27, 2020.

(30) Foreign Application Priority Data

Mar. 29, 2019 (JP) .................................. 2019-068764

(51) Int. Cl.
  *H01R 4/26* (2006.01)
  *H01R 4/02* (2006.01)
  (Continued)

(52) U.S. Cl.
  CPC ............... *H01R 4/26* (2013.01); *H01R 4/023* (2013.01); *H01R 4/2406* (2018.01); *H05K 1/181* (2013.01);
  (Continued)

(58) Field of Classification Search
  CPC .......... H01R 4/26; H01R 4/023; H01R 12/57; H01R 12/53; H01R 4/2406; H01R 4/2404;
  (Continued)

(56) References Cited

U.S. PATENT DOCUMENTS

2002/0153158 A1* 10/2002 Saito .................... H01R 4/2406
    174/84 C
2012/0061140 A1* 3/2012 Nonen ................. H05K 3/3405
    29/843
(Continued)

FOREIGN PATENT DOCUMENTS

JP    2002270253    *    9/2002
JP    2002270253 A         9/2002
(Continued)

OTHER PUBLICATIONS

English Translation JP2007335260. Published Dec. 27, 2007, Epson Imagaing Devices Corp (Year: 2007).*

(Continued)

*Primary Examiner* — Steven T Sawyer
(74) *Attorney, Agent, or Firm* — Dorsey & Whitney LLP

(57) ABSTRACT

To provide a connected structure of a substrate and an electric wire with high connection reliability even when a carbon nanotube wire with an average diameter of 0.05 mm to 3.00 mm is used as the electric wire. The connected structure of the substrate and the carbon nanotube wire includes a substrate; a carbon nanotube wire made of one or more carbon nanotube aggregates each including a plurality of carbon nanotubes, the carbon nanotube wire having an average diameter of 0.05 mm to 3.00 mm; a conductive fixing member, part of which is provided between the substrate and the carbon nanotube wire; and a conductive member that electrically connects the carbon nanotube wire and the fixing member.

17 Claims, 5 Drawing Sheets

(51) Int. Cl.
  *H01R 4/2406* (2018.01)
  *H05K 1/18* (2006.01)
  *H01R 12/53* (2011.01)
(52) U.S. Cl.
  CPC ........ *H01R 12/53* (2013.01); *H05K 2201/026* (2013.01); *H05K 2201/10356* (2013.01)
(58) Field of Classification Search
  CPC ......... H05K 1/181; H05K 2201/10356; H05K 3/325; H05K 3/34; H05K 2201/026; H05K 2201/0323; H05K 2201/10227; H05K 2201/10287; H05K 2201/1031; H05K 2203/0195; Y02P 70/50
  See application file for complete search history.

(56) References Cited

U.S. PATENT DOCUMENTS

| | | | | |
|---|---|---|---|---|
| 2013/0217279 | A1* | 8/2013 | Hemond | H01R 4/188 977/742 |
| 2013/0337604 | A1 | 12/2013 | Ozawa | |
| 2014/0065855 | A1* | 3/2014 | Rice | H01R 12/57 29/761 |
| 2014/0073171 | A1* | 3/2014 | Tarulli | H01R 4/2495 439/421 |
| 2019/0296464 | A1* | 9/2019 | Taschner | H01R 12/592 |

FOREIGN PATENT DOCUMENTS

| | | | |
|---|---|---|---|
| JP | 2003317819 | * | 11/2003 |
| JP | 2003317819 | A | 11/2003 |
| JP | 2014053287 | A | 3/2014 |
| JP | 2016126848 | * | 7/2016 |
| JP | 2016126848 | A | 7/2016 |
| JP | 2017174689 | * | 9/2017 |
| JP | 2017174689 | A | 9/2017 |

OTHER PUBLICATIONS

International Search Report and Written Opinion [English translation for ISR only], mailed Jun. 30, 2020, for PCT Application No. PCT/JP2020/013911.
The Extended European Search Report for European Patent Application No. 20782713.0 dated Apr. 5, 2023, pp. all.
English translation of International Preliminary Report on Patentability for Application No. PCT/JP2020/013911, dated Sep. 28, 2021.
English translation of Written Opinion for Application No. PCT/JP2020/013911,dated Jun. 30, 2020.

* cited by examiner

CONNECTED STRUCTURE OF SUBSTRATE AND CARBON NANOTUBE WIRE

CROSS REFERENCE TO RELATED APPLICATIONS

The present application is a continuation application of International Patent Application No. PCT/JP2020/013911 filed on Mar. 27, 2020, which claims the benefit of Japanese Patent Application No. 2019-068764, filed on Mar. 29, 2019. The contents of these applications are incorporated herein by reference in their entirety.

BACKGROUND

Technical Field

The present disclosure relates to a connected structure of a carbon nanotube wire, which is made of one or more carbon nanotube aggregates each including a plurality of carbon nanotubes and has an average diameter of 0.05 mm to 3.00 mm, and a substrate.

Background

For electrically connecting an electric wire to a substrate or to an electrode of a device, a conductive paste such as solder may be used. In particular, when the electric wire is a thin wire with an average diameter of 0.05 mm to 3.00 mm, a conductive paste such as solder is typically used.

As a connected structure obtained by electrically connecting an electric wire to an electrode using a conductive paste such as solder, a solar cell obtained by soldering an electric wire to a thick-film electrode formed on a substrate is disclosed (Japanese Patent Application Publication No. 2014-53287), for example. In Japanese Patent Application Publication No. 2014-53287, a metal wire of a copper material and the like is used as the electric wire.

Meanwhile, various attempts have been made to use a carbon nanotube wire as a material of an electrical wire, replacing a metal wire, due to its excellent properties, such as its light weight, electroconductivity, thermal conductivity, and mechanical strength. However, since a carbon nanotube wire is made of a carbon material, it has low wettability to solder, which in turn may pose a problem in the connection reliability between the carbon nanotube wire and its connection target.

In addition, a thin carbon nanotube wire with an average diameter of 0.05 mm to 3.00 mm is more flexible and is more likely to bend than is a metal wire with the same diameter. Thus, such a carbon nanotube wire bends irregularly and is difficult to be disposed at an intended spot. Therefore, when a thin carbon nanotube wire is electrically connected to a connection target using a conductive paste such as solder, the carbon nanotube wire is difficult to be fixed to the connection target, which in turn may pose a problem in the connection reliability between the carbon nanotube wire and the connection target. Further, from the perspective of the level of technology for producing a carbon nanotube wire, production of a long, thin, uniform wire requires a high level of technique. Thus, there has been no established method of reliably connecting a carbon nanotube wire with an average diameter of 0.05 mm to 3.00 mm to an electrode on a substrate and the like.

SUMMARY

The present disclosure has been made in view of the foregoing circumstances, and it is an object of the present disclosure to provide a connected structure of a substrate and an electric wire with high connection reliability even when a carbon nanotube wire with an average diameter of 0.05 mm to 3.00 mm is used as the electric wire.

A summary of features of the present disclosure is as follows.

[1] A connected structure of a substrate and a carbon nanotube wire, including a substrate; a carbon nanotube wire made of one or more carbon nanotube aggregates each including a plurality of carbon nanotubes, the carbon nanotube wire having an average diameter of 0.05 mm to 3.00 mm; a conductive fixing member, part of which is provided between the substrate and the carbon nanotube wire; and a conductive member that electrically connects the carbon nanotube wire and the fixing member.

[2] A connected structure of a substrate and a carbon nanotube wire, including a substrate; a carbon nanotube wire made of one or more carbon nanotube aggregates each including a plurality of carbon nanotubes, the carbon nanotube wire having an average diameter of 0.05 mm to 3.00 mm; and a conductive fixing member, part of which is provided between the substrate and the carbon nanotube wire, in which the fixing member includes a penetration portion penetrating the carbon nanotube wire, and the carbon nanotube wire and the fixing member are electrically connected via the penetration portion.

[3] The connected structure according to [1] or [2], in which the fixing member is an electrode mounted on the substrate.

[4] The connected structure according to [1], in which the conductive member is solder.

[5] The connected structure according to any one of [1] to [4], in which the fixing member includes a needle-like member, and the needle-like member includes a contact portion in contact with the carbon nanotube wire.

[6] The connected structure according to [5], in which the needle-like member includes an anchoring portion, the anchoring portion being adapted to anchor the carbon nanotube wire at a portion of the carbon nanotube wire on a side not facing the substrate.

[7] The connected structure according to [6], in which the carbon nanotube wire is subjected to stress from the anchoring portion of the needle-like member.

[8] The connected structure according to any one of [5] to [7], in which the needle-like member includes a plurality of needle-like members arranged along a longitudinal direction of the carbon nanotube wire located on the fixing member.

[9] The connected structure according to any one of [5] to [8], in which the needle-like member includes a plurality of needle-like members arranged along a transverse direction of the carbon nanotube wire located on the fixing member.

[10] The connected structure according to any one of [5] to [7], in which the needle-like member includes a plurality of needle-like members arranged in a diagonal direction with respect to a longitudinal direction of the carbon nanotube wire located on the fixing member.

[11] The connected structure according to any one of [5] to [10], in which the needle-like member penetrates the carbon nanotube wire along a radial direction of the carbon nanotube wire.

In the aspect of [1] above, a carbon nanotube wire is fixed to a conductive fixing member, and further, the carbon nanotube wire is fixed to a substrate via the conductive fixing member.

According to an aspect of the present disclosure, a conductive fixing member provided on a substrate, and a conductive member that electrically connects a carbon nanotube wire and the fixing member are included, whereby it is possible to obtain a connected structure of a substrate and an electric wire with high connection reliability even when a carbon nanotube wire with an average diameter of 0.05 mm to 3.00 mm is used as the electric wire.

According to an aspect of the present disclosure, the fixing member includes a needle-like member, and the needle-like member includes a contact portion in contact with the carbon nanotube wire, whereby it is possible to facilitate the operation of fixing the carbon nanotube wire to the fixing member, thereby further improving the connection reliability between the fixing member and the carbon nanotube wire as well as fixation stability.

According to an aspect of the present disclosure, the needle-like member includes an anchoring portion, the anchoring portion being adapted to anchor the carbon nanotube wire at a portion of the carbon nanotube wire on the side not facing the substrate, whereby it is possible to further improve the aforementioned connection reliability and fixation stability, and increase the contact area between the fixing member and the carbon nanotube wire, thereby improving the electroconductivity between the fixing member and the carbon nanotube wire and the contact property between the carbon nanotube wire and the conductive member.

According to an aspect of the present disclosure, the carbon nanotube wire is subjected to stress from the anchoring portion of the needle-like member, whereby it is possible to further improve the aforementioned connection reliability and fixation stability, and improve the contact property between the fixing member and the carbon nanotube wire, thereby further improving the electroconductivity between the fixing member and the carbon nanotube wire and the contact property between the carbon nanotube wire and the conductive member.

According to an aspect of the present disclosure, the needle-like member includes a plurality of needle-like members arranged along the longitudinal direction of the carbon nanotube wire, whereby it is possible to obtain further excellent connection reliability between the fixing member and the carbon nanotube wire and further excellent fixation stability.

According to an aspect of the present disclosure, the needle-like member penetrates the carbon nanotube wire along the radial direction of the carbon nanotube wire, whereby it is possible to obtain further excellent connection reliability and further excellent fixation stability.

BRIEF DESCRIPTION OF DRAWINGS

FIGS. 6A-C Views illustrating the steps of producing the connected structure according to the first embodiment of the present disclosure by fixing the carbon nanotube wire to the substrate in which FIG. 6A is a view illustrating a member prepared in producing the connected structure, FIG. 6B is a view illustrating a state in which the carbon nanotube wire is anchored using needle-like members of a fixing member, and FIG. 6C is a view illustrating a state in which the fixing member and the carbon nanotube wire are electrically connected using solder.

DETAILED DESCRIPTION

Hereinafter, a connected structure of a substrate and a carbon nanotube wire according to embodiments of the present disclosure will be described with reference to the drawings. It should be noted that FIG. 1 is a perspective external view illustrating an overview of a connected structure of a substrate and a carbon nanotube wire according to a first embodiment of the present disclosure, and FIG. 2 is a side cross-sectional view of the connected structure of the substrate and the carbon nanotube wire according to the first embodiment of the present disclosure.

Figure 1:
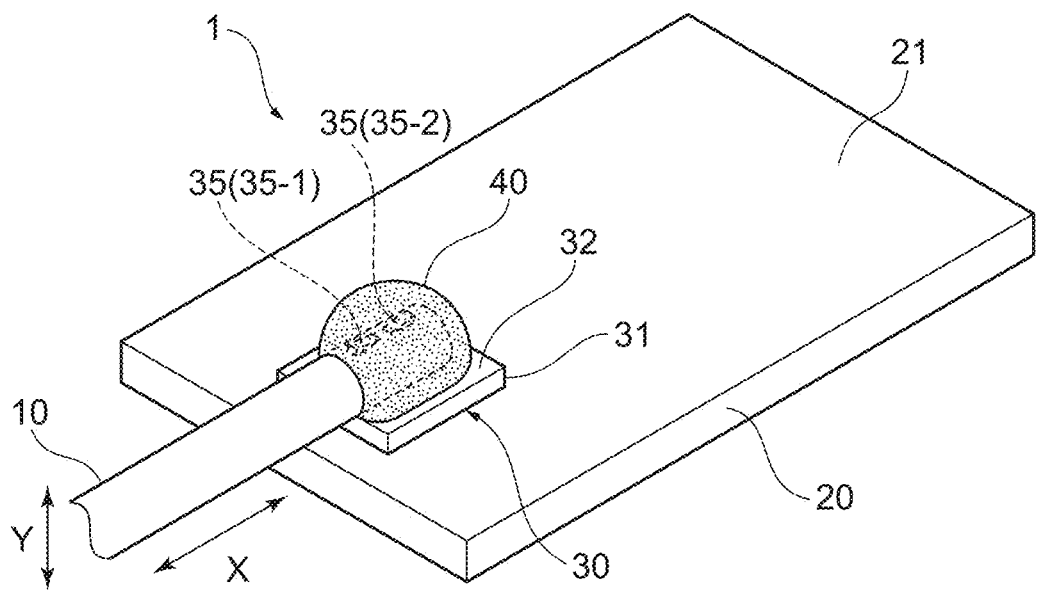
FIG. 1 A perspective external view illustrating an overview of a connected structure of a substrate and a carbon nanotube wire according to a first embodiment of the present disclosure.
Figure 2:
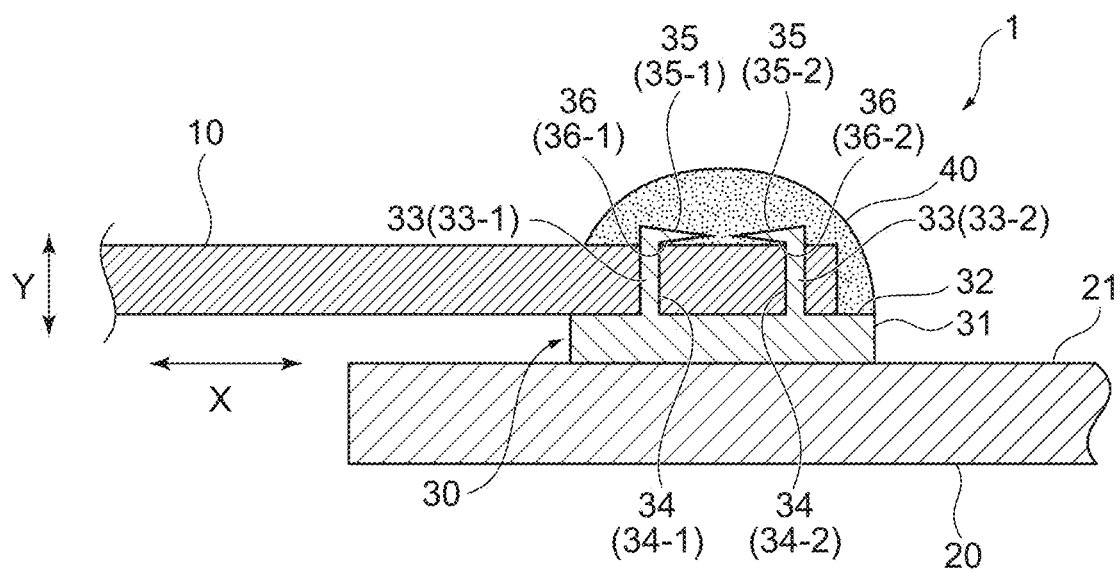
FIG. 2 A side cross-sectional view of the connected structure of the substrate and the carbon nanotube wire according to the first embodiment of the present disclosure.

As illustrated in FIGS. 1 and 2, a connected structure (hereinafter also referred to as a "CNT connected structure") 1 of a substrate and a carbon nanotube wire according to the first embodiment of the present disclosure includes a carbon nanotube wire (hereinafter also referred to as a "CNT wire") 10, a conductive fixing member 30, part of which is provided between a substrate 20 and the CNT wire 10, and a conductive member 40 that electrically connects the CNT wire 10 and the fixing member 30. The conductive fixing member 30 is mounted on the substrate 20, and an end of the CNT wire 10 is fixed to the conductive fixing member 30. Thus, the CNT wire 10 is fixed to the substrate 20 via the conductive fixing member 30.

Examples of the substrate 20 include a circuit board that has small electronic components, such as semiconductor devices, mounted thereon and is attached to a precision electronic instrument.

The CNT wire 10 functions as an electric wire for sending electricity to the substrate 20 from a power supply (not illustrated), for example. The CNT wire 10 has excellent electroconductivity comparable to that of a wire made of copper, aluminum, or the like, and thus is used as a core wire of an electric wire. As described below, the CNT wire 10 is a thin wire and has a function of a signal wire for sending an electric signal to the substrate 20, for example.

The CNT wire 10 is formed of one or more (bundled) carbon nanotube aggregates (hereinafter also referred to as "CNT aggregates") each including a plurality of carbon nanotubes (hereinafter also referred to as "CNTs") each having a layer structure of one or more layers. Herein, the CNT wire means a CNT wire in which the proportion of CNTs is greater than or equal to 90 mass %. It should be noted that for calculation of the proportion of CNTs in the CNT wire, the proportions of plating and dopants are excluded. The longitudinal direction of the CNT aggregate(s) forms the longitudinal direction of the CNT wire 10. Thus, the CNT aggregate(s) is/are linear. The plurality of CNT aggregates of the CNT wire 10 are arranged such that their long axis directions are substantially uniformly aligned. Thus, the plurality of CNT aggregates of the CNT wire 10 are oriented.

The average diameter of the CNT wire 10 is as thin as 0.05 mm to 3.00 mm. It should be noted that the "diameter" of the average diameter means the equivalent circle diameter. The average diameter of the CNT wire 10 is not limited to a particular diameter as long as it is 0.05 mm to 3.00 mm, but is preferably 0.20 mm to 3.00 mm. The CNT wire 10 may be either an element wire (i.e., solid wire) made of a single CNT wire 10 or a strand wire obtained by twisting a plurality of CNT wires 10 together. In addition, the CNT wire 10 may be either in the form of a CNT wire not provided with an insulating coating layer or a coated CNT electric wire obtained by covering the peripheral surface of the CNT wire 10 with an insulating coating layer along the longitudinal direction.

As illustrated in FIGS. 1 and 2, the conductive fixing member 30 is mounted on a surface 21 of the substrate 20. The fixing member 30 includes a base 31 in a substantially plate-like shape, and a needle-like member 33 extending from a surface 32 of the base 31 in the vertical direction and in the direction opposite to the substrate 20. The base 31 is provided between the substrate 20 and the CNT wire 10 along the surface 21 of the substrate 20. The base 31 is in contact with the CNT wire 10.

The needle-like member 33 includes a plurality of needle-like members arranged along a longitudinal direction X of the CNT wire 10 located on the fixing member 30, that is, substantially in parallel with the longitudinal direction X of the CNT wire 10 located on the fixing member 30. In the CNT connected structure 1 of FIGS. 1 and 2, two needle-like members 33-1 and 33-2 are arranged side by side with a predetermined gap therebetween along the longitudinal direction X of the CNT wire 10. Each needle-like member 33 has a shape with a pointed tip 35, such as the tip 35 being conical, triangular pyramidal, or quadrangular pyramidal in shape, for example. Alternatively, instead of the shape with the pointed tip 35, each needle-like member 33 may have a spear shape, such as a shape with the tip of the needle-like member 33 having a folded portion, for example. When the tip of the needle-like member 33 has a folded portion, it is possible to securely fix the CNT wire to the fixing member without performing the step of bending the tip that protrudes beyond the peripheral surface of the CNT wire described below. The needle-like members 33-1 and 33-2 penetrate the CNT wire 10 along a radial direction Y of the CNT wire 10. Thus, the needle-like members 33 are stuck into the CNT wire 10 so that the tips 35 of the needle-like members 33 protrude beyond the peripheral surface of the CNT wire 10. The positions of the CNT wire 10 penetrated by the needle-like members 33 are not limited to particular positions, but in the CNT connected structure 1, the needle-like members 33-1 and 33-2 each penetrate the CNT wire 10 across its maximum dimension in the radial direction Y. Each needle-like member 33 has a first contact portion 34 in contact with the CNT wire 10 by penetrating the CNT wire 10. Thus, the needle-like members 33-1 and 33-2 respectively have first contact portions 34-1 and 34-2 in contact with the CNT wire 10.

The length of each needle-like member 33 is not limited to a particular length. However, since the average diameter of the CNT wire 10 is 0.05 mm to 3.00 mm, the length of each needle-like member 33 is preferably 0.06 mm to 4.00 mm and also 1.2 times to 2.0 times the diameter of the CNT wire 10 at the first contact portion 34 with a view to improving the fixation stability for the CNT wire 10. In addition, the thickness of each needle-like member 33 at its portion rising from the base 31 is not limited to a particular thickness. However, the thickness of each needle-like member 33 is preferably 0.01 mm to 0.10 mm and also less than or equal to half the maximum diameter of the CNT wire 10 at the first contact portion 34 with a view to improving the fixation stability for the CNT wire 10 that has an average diameter of 0.05 mm to 3.00 mm. Further, the gap between the needle-like members 33-1 and 33-2 at their portions rising from the base 31 is not limited to a particular gap. However, as described below, when the CNT wire 10 is fixed to the fixing member 30 with the tips 35 of the needle-like members 33 bent, the gap between the needle-like members 33-1 and 33-2 is preferably 0.8 times to 1.2 times the length of each needle-like member 33 with a view to improving the fixation stability for the CNT wire 10.

As illustrated in FIGS. 1 and 2, as the tips 35 of the needle-like members 33 protruding beyond the peripheral surface of the CNT wire 10 are bent so as to contact the peripheral surface of the CNT wire 10 along the longitudinal direction X of the CNT wire 10, second contact portions 36 in contact with the CNT wire 10 are provided. A tip 35-1 of the needle-like member 33-1 is bent in the direction of the opposed needle-like member 33-2, thus providing a second contact portion 36-1. A tip 35-2 of the needle-like member 33-2 is bent in the direction of the opposed needle-like member 33-1, thus providing a second contact portion 36-2. The second contact portions 36 of the needle-like members 33 are in contact with portions of the peripheral surface of the CNT wire 10 on the side not facing the substrate 20. Thus, the CNT wire 10 is sandwiched between the second contact portions 36 of the needle-like members 33 and the base 31.

As each needle-like member 33 of the fixing member 30 has the first contact portion 34 and the second contact portion 36 that are in contact with the CNT wire 10, the CNT wire 10 is fixed to the fixing member 30. In other words, each needle-like member 33 has an anchoring portion for anchoring the CNT wire 10 at a portion of the CNT wire 10 on the side not facing the substrate 20.

The CNT wire 10 is subjected to stress from the second contact portions 36 that are the anchoring portions of the needle-like members 33. The direction of the stress from the second contact portions 36 that the CNT wire 10 is subjected to coincides with the direction of the base 31. Thus, the second contact portions 36 of the needle-like members 33 are pressed against the CNT wire 10 so that the CNT wire 10 is compressed at portions corresponding to the second contact portions 36.

The fixing member 30 can be provided with a function of an electrode mounted on the substrate 20, for example. When the fixing member 30 functions as an electrode, the material of the fixing member 30 may be, for example, copper, copper alloy, aluminum, aluminum alloy, gold, gold alloy, silver, or silver alloy. In addition, when the fixing member 30 functions as an electrode, the surface of the fixing member 30 may be provided with a plating film as appropriate so as to improve the wettability of the conductive member 40 to the fixing member 30.

As illustrated in FIGS. 1 and 2, portions of the CNT wire 10 in contact with the needle-like members 33 and their periphery are provided with the conductive member 40. The conductive member 40 is provided around a region from the CNT wire 10 to the fixing member 30. The conductive member 40 has a function of electrically connecting the CNT wire 10 and the fixing member 30 and also securely fixing the CNT wire 10 to the fixing member 30. In the CNT connected structure 1, the entire exposed peripheral surface of the CNT wire 10 located on the fixing member 30 is dipped in the conductive member 40.

Examples of the conductive member 40 include solder. When the material of the fixing member 30 is a metal, the fixing member 30 has excellent wettability to solder. Thus, the electrical connectivity between the CNT wire 10 and the fixing member 30 is excellent. Examples of the types of solder include solder for carbon materials, such as C-Solder (manufactured by CAMETICS LTD.), Sn—Pb alloy-based solder, and Sn—Ag—Cu alloy-based solder.

As the CNT connected structure 1 includes the conductive fixing member 30 provided on the substrate 20, and the conductive member 40 for electrically connecting the CNT wire 10 and the fixing member 30, the substrate 20 and the CNT wire 10 are connected with excellent reliability even when the CNT wire 10 with an average diameter of 0.05 mm to 3.00 mm is used as the electric wire.

In the CNT connected structure 1, as the fixing member 30 includes the needle-like members 33 and the needle-like members 33 are in contact with the CNT wire 10, it is possible to facilitate the operation of fixing the CNT wire 10 to the fixing member 30 and improve the connection reliability between the fixing member 30 and the CNT wire 10 as well as fixation stability. Further, as each needle-like member 33 has an anchoring portion for anchoring the CNT wire 10 at a portion of the CNT wire 10 on the side not facing the substrate 20, the aforementioned connection reliability and fixation stability can be improved. Moreover, as the contact area between the fixing member 30 and the CNT wire 10 is increased, the electroconductivity between the fixing member 30 and the CNT wire 10 as well as the contact property between the CNT wire 10 and the conductive member 40 improves.

In the CNT connected structure 1, as the CNT wire 10 is subjected to stress from the second contact portions 36 of the needle-like members 33, it is possible to improve the contact property between the fixing member 30 and the CNT wire 10 while improving the aforementioned connection reliability and fixation stability, thus providing excellent electroconductivity between the fixing member 30 and the CNT wire 10 as well as excellent contact property between the CNT wire 10 and the conductive member 40.

In the CNT connected structure 1, as the plurality of needle-like members 33 are arranged along the longitudinal direction X of the CNT wire 10, excellent connection reliability and excellent fixation stability can be provided between the fixing member 30 and the CNT wire 10.

Figure 3:
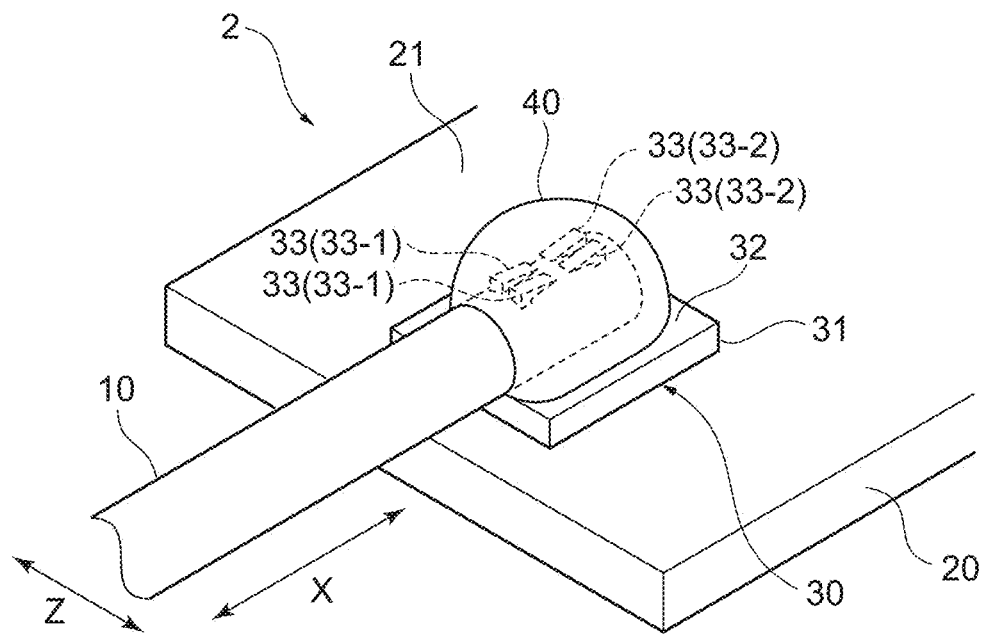
FIG. 3 A perspective external view illustrating an overview of a connected structure of a substrate and a carbon nanotube wire according to a second embodiment of the present disclosure.

Next, a connected structure of a substrate and a carbon nanotube wire according to a second embodiment of the present disclosure will be described. It should be noted that the main configuration of the connected structure of the substrate and the carbon nanotube wire according to the second embodiment is the same as that according to the first embodiment. Thus, the same components will be described using the same reference numerals. FIG. 3 is a perspective external view illustrating an overview of the connected structure of the substrate and the carbon nanotube wire according to the second embodiment of the present disclosure.

In the CNT connected structure according to the first embodiment, a plurality of needle-like members are arranged side by side with the predetermined gap therebetween along the longitudinal direction of the CNT wire. Instead, as illustrated in FIG. 3, in a CNT connected structure 2 according to the second embodiment, a plurality of needle-like members 33 are respectively arranged side by side with predetermined gaps therebetween along the longitudinal direction X and a transverse direction Z of the CNT wire 10. In the CNT connected structure 2, two needle-like members 33-1 and 33-2 are arranged side by side with a predetermined gap therebetween along the longitudinal direction X of the CNT wire 10, and two needle-like members 33-1 and 33-2 are arranged side by side with a predetermined gap therebetween along the transverse direction Z of the CNT wire 10.

In the CNT connected structure 2, the plurality of needle-like members 33 are arranged not only along the longitudinal direction X but also along the transverse direction Z of the CNT wire 10. This can further improve the connection reliability between the fixing member 30 and the CNT wire 10 and fixation stability.

Figure 4:
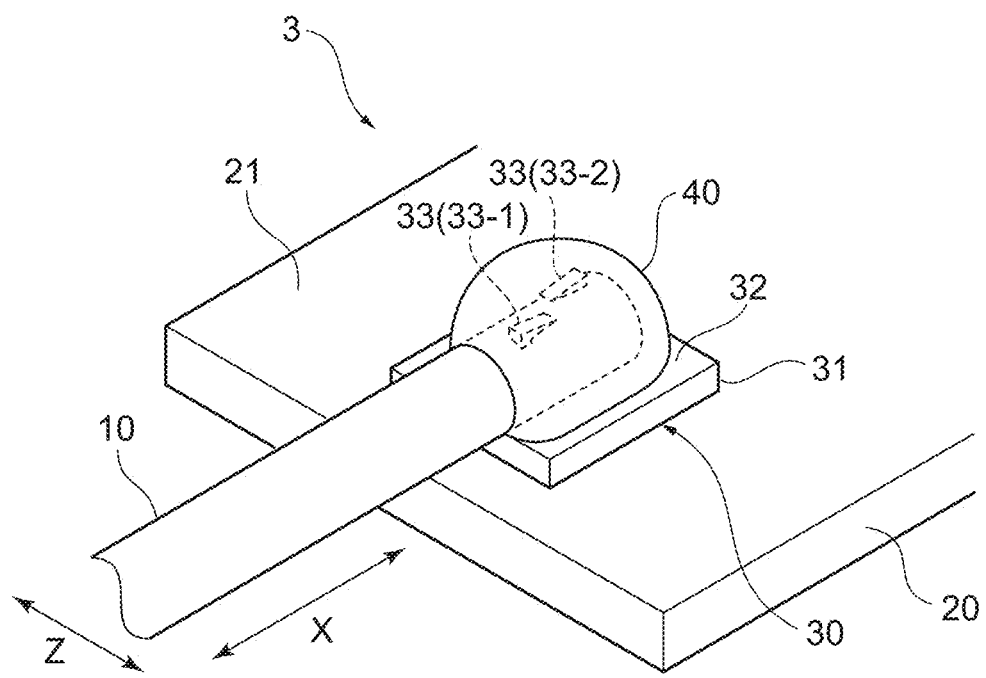
FIG. 4 A perspective external view illustrating an overview of a connected structure of a substrate and a carbon nanotube wire according to a third embodiment of the present disclosure.

Next, a connected structure of a substrate and a carbon nanotube wire according to a third embodiment of the present disclosure will be described. It should be noted that the main configuration of the connected structure of the substrate and the carbon nanotube wire according to the third embodiment is the same as those according to the first and second embodiments. Thus, the same components will be described using the same reference numerals. FIG. 4 is a perspective external view illustrating an overview of the connected structure of the substrate and the carbon nanotube wire according to the third embodiment of the present disclosure.

In the CNT connected structure according to the first embodiment, a plurality of needle-like members are arranged side by side with the predetermined gap therebetween along the longitudinal direction of the CNT wire. Instead, as illustrated in FIG. 4, in a CNT connected structure 3 according to the third embodiment, a plurality of needle-like members 33 are arranged side by side with a predetermined gap therebetween in a diagonal direction with respect to the longitudinal direction X of the CNT wire 10. In the CNT connected structure 3, two needle-like members 33-1 and 33-2 are arranged side by side with the predetermined gap therebetween in the diagonal direction with respect to the longitudinal direction X of the CNT wire 10.

In the CNT connected structure 3, as the plurality of needle-like members 33 are arranged in the diagonal direction with respect to the longitudinal direction X of the CNT wire 10, the bending direction of the tips of the needle-like members 33 can be more easily adjusted as appropriate, thus providing high connection reliability between the fixing member 30 and the CNT wire 10 and high fixation stability regardless of whether the radial dimension of the CNT wire 10 is large or small. In addition, in the CNT connected structure 3, the force of anchoring the CNT wire 10 can be increased not only in the longitudinal direction X but also in the transverse direction Z with a small number of needle-like members 33 arranged.

Figure 5:
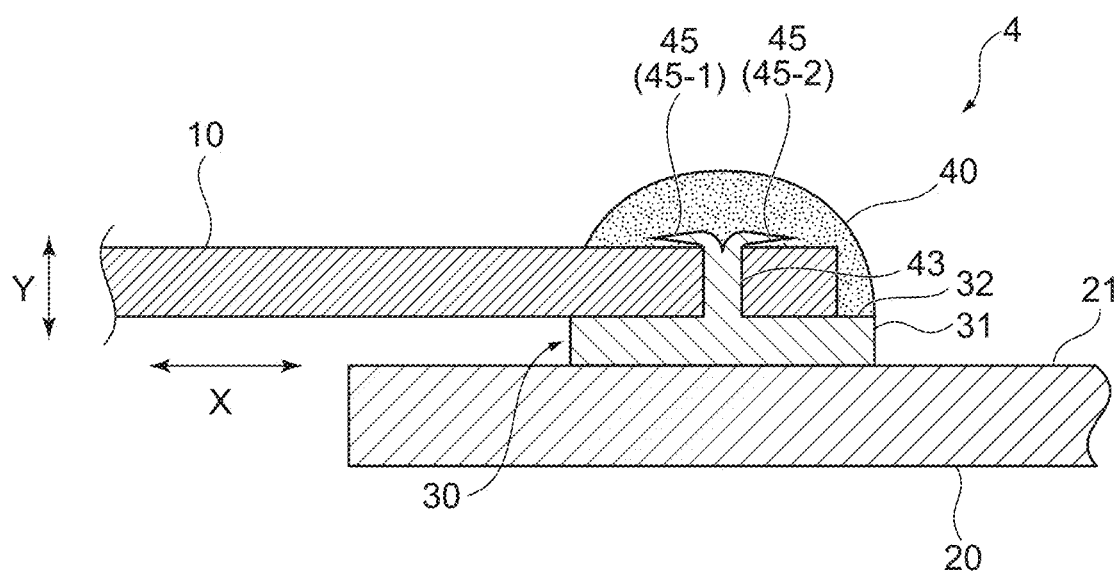
FIG. 5 A side cross-sectional view illustrating an overview of a connected structure of a substrate and a carbon nanotube wire according to a fourth embodiment of the present disclosure.

Next, a connected structure of a substrate and a carbon nanotube wire according to a fourth embodiment of the present disclosure will be described. It should be noted that the main configuration of the connected structure of the substrate and the carbon nanotube wire according to the fourth embodiment is the same as those according to the first to third embodiments. Thus, the same components will be described using the same reference numerals. FIG. 5 is a side cross-sectional view illustrating an overview of the connected structure of the substrate and the carbon nanotube wire according to the fourth embodiment of the present disclosure.

In each of the CNT connected structures according to the first to third embodiments, the tips of the needle-like members are bent in predetermined directions. Instead, as illustrated in FIG. 5, in a CNT connected structure 4 according to the fourth embodiment, a tip 45 of a needle-like member 43 is split into a plurality of portions and bent. Thus, a single needle-like member 43 has a plurality of tips 45. In the CNT connected structure 4, the tip 45 is split into two portions: a first portion 45-1 and a second portion 45-2 and bent.

In the CNT connected structure 4, the first portion 45-1 is bent in a direction different from that of the second portion 45-2. The bending direction of the tip 45 is not limited to a particular direction, and in the CNT connected structure 4, the first portion 45-1 and the second portion 45-2 are bent along the longitudinal direction X of the CNT wire 10. In addition, the first portion 45-1 is bent in a direction opposite to the second portion 45-2, and the second portion 45-2 is bent in a direction opposite to the first portion 45-1.

In the CNT connected structure 4, the contact property between the needle-like member 43 and the conductive member 40 further improves, which in turn can improve the connection reliability between the fixing member 30 and the CNT wire 10 as well as fixation stability.

Figure 6A:
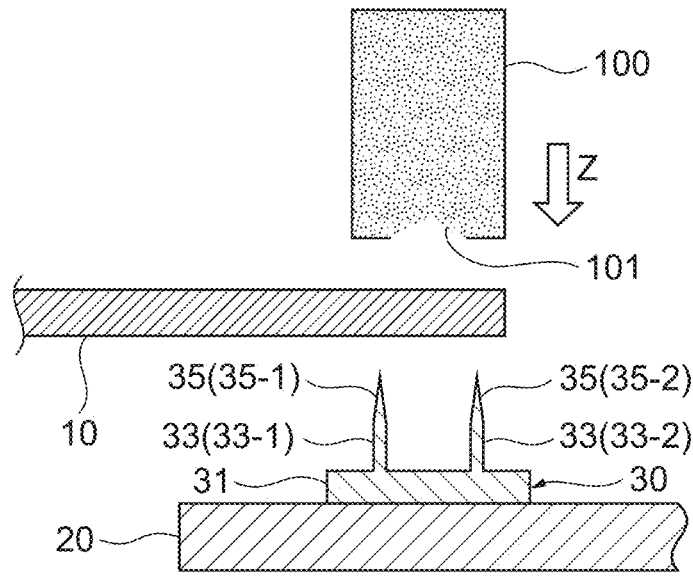
Figure 6B:
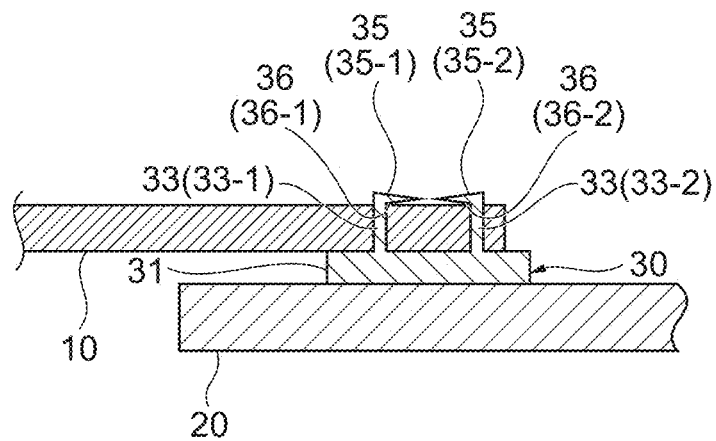
Figure 6C:
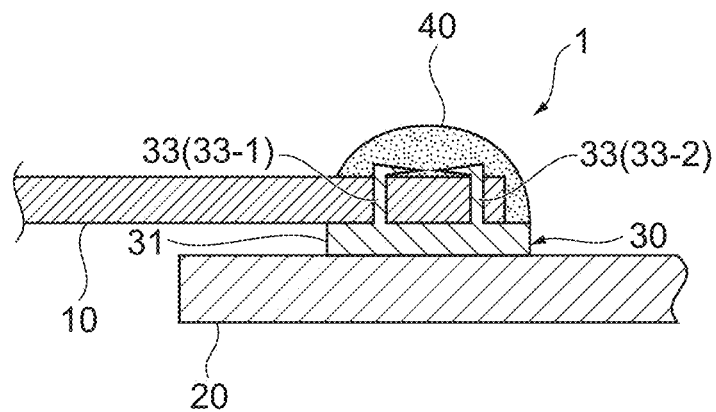

Next, an exemplary method for producing a CNT connected structure will be described with reference to FIGS. 6A-C. Herein, an exemplary method for producing the CNT connected structure 1 of the first embodiment will be described. FIGS. 6A-C illustrate the steps of producing the connected structure 1 according to the embodiment of the present disclosure by fixing the CNT wire 10 to the substrate 20 in which FIG. 6A is a view illustrating a member prepared in producing the connected structure 1, FIG. 6B is a view illustrating a state in which the CNT wire 10 is anchored using the needle-like members 33 of the fixing member 30, and FIG. 6C is a view illustrating a state in which the fixing member 30 and the CNT wire 10 are electrically connected using solder that is the conductive member 40.

First, as illustrated in FIG. 6A, the substrate 20 having the fixing member 30 mounted thereon, the CNT wire 10 (i.e., electric wire) with an average diameter of 0.05 mm to 3.00 mm, and a crimping jig 100 for fixing an end of the CNT wire 10 to the fixing member 30 are prepared. In the prepared fixing member 30, the needle-like members 33 extend linearly in the vertical direction from the base 31. Next, the needle-like members 33 are allowed to be stuck into an end of the CNT wire 10 so that the needle-like members 33 penetrate the CNT wire 10. At this time, the needle-like members 33 are allowed to penetrate the CNT wire 10 until the peripheral surface of the CNT wire 10 on the side facing the base 31 contacts the base 31 so that the tips 35 of the needle-like members 33 protrude beyond the peripheral surface of the CNT wire 10. Next, a crimping face 101 of the crimping jig 100 is allowed to abut the tips of the needle-like members 33 and is pressed in the direction of the base 31 (i.e., Z-direction in FIG. 6A). As the crimping face 101 of the crimping jig 100 is pressed in the direction of the base 31, the tips 35 protruding beyond the peripheral surface of the CNT wire 10 are bent so as to contact the peripheral surface of the CNT wire 10 along the longitudinal direction of the CNT wire 10 as illustrated in FIG. 6B.

The crimping face 101 of the crimping jig 100 has a triangular cross-section. Therefore, the tip 35-1 of the needle-like member 33-1 is bent in the direction of the opposed needle-like member 33-2, thus providing the second contact portion 36-1, while the tip 35-2 of the needle-like member 33-2 is bent in the direction of the opposed needle-like member 33-1, thus providing the second contact portion 36-2.

Next, as illustrated in FIG. 6C, solder that is the conductive member 40 is supplied to a region from the CNT wire 10 to the fixing member 30 so that the entire exposed peripheral surface of the CNT wire 10 located on the fixing member 30 is dipped in the solder. With the conductive member 40, the CNT wire 10 and the fixing member 30 are electrically connected and the CNT wire 10 is securely fixed to the fixing member 30 so that the CNT connected structure 1 can be produced.

Next, other embodiments of CNT connected structures of the present disclosure will be described. In the CNT connected structure of the first embodiment, two needle-like members are arranged side by side with the predetermined gap therebetween along the longitudinal direction of the CNT wire. Instead, a single needle-like member may be arranged or three or more needle-like members may be arranged side by side with predetermined gaps therebetween along the longitudinal direction of the CNT wire. In the CNT connected structure according to the second embodiment, the same number of needle-like members are arranged side by side with predetermined gaps therebetween along the longitudinal direction and the transverse direction of the CNT wire. Instead, different numbers of needle-like members may be arranged along the longitudinal direction and the transverse direction of the CNT wire. For example, more needle-like members may be arranged in the longitudinal direction of the CNT wire than in the transverse direction. In each of the aforementioned embodiments, the tip of each needle-like member is bent in the direction of the opposed needle-like member. Instead, the tip of each needle-like member may be bent in a direction opposite to the opposed needle-like member. In each of the CNT connected structures of the aforementioned embodiments, the needle-like members penetrate the CNT wire. Instead, two needle-like members may be arranged along the radial direction of the CNT wire so as to sandwich the CNT wire therebetween. In each of the aforementioned embodiments, a conductive member for electrically connecting the CNT wire and the fixing member is provided. Instead, the conductive member need not be provided if the fixing member has a penetration portion, such as a needle-like member, that penetrates the CNT wire, and the CNT wire and the fixing member are electrically connected via the penetration portion, for example.

Example

Next, an Example of a CNT connected structure of the present disclosure will be described, but the present disclosure is not limited to the aspects of the Example.

Figure 7:
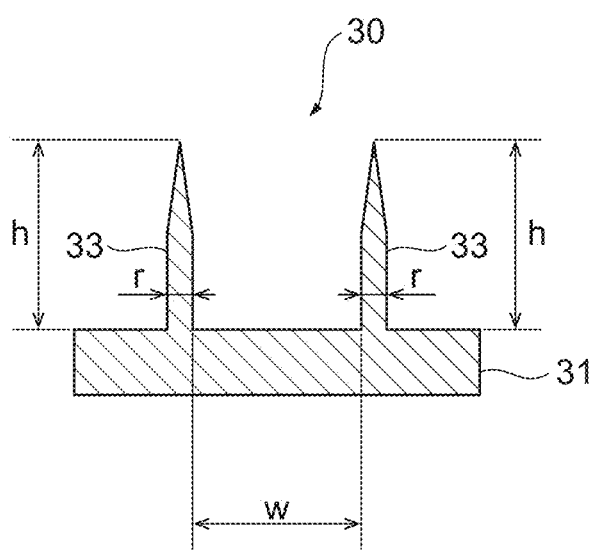
FIG. 7 A view illustrating a fixing member used in Example.

In an Example, a CNT connected structure equivalent to the CNT connected structure 1 of the aforementioned first embodiment was used. Specifically, as illustrated in FIG. 7, the fixing member 30 was used in which the thickness (r) of each needle-like member 33 at its portion rising from the base 31 is 0.05 mm, the gap (w) between the needle-like members 33 is 1.5 mm, and the height (h) of each needle-like member 33 is 1.5 mm. As the CNT wire, a CNT wire with a diameter of 1.0 mm was used. The CNT wire with a diameter of 1.0 mm was fixed to the fixing member 30 illustrated in FIG. 7 based on the aforementioned exemplary method for producing a CNT connected structure so that the CNT connected structure of the Example was produced.

The CNT connected structure of the Example was evaluated in terms of fixation stability, appearance, and electroconductivity.

(1) Fixation Stability

A tensile test of 0.01 N was conducted on the CNT wire of the CNT connected structure along the longitudinal direction of the CNT wire using a tensile tester ("EZ-SX" manufactured by Shimadzu Corporation) so that whether or not the CNT wire came off the CNT connected structure was evaluated.

(2) Appearance

Whether or not the CNT wire at portions anchored by the needle-like members 33 was completely covered with solder, which is a conductive member, was visually observed.

(3) Electroconductivity

The contact resistance between the CNT wire and the fixing member 30 was measured using a digital multimeter ("DMM2000" manufactured by Keithley Instruments).

From the tensile test, the CNT connected structure of the Example was found to have excellent fixation stability because the CNT wire did not come off the CNT connected structure. In addition, in the CNT connected structure of the Example, the CNT wire at portions anchored by the needle-like members 33 was completely covered with solder. Thus, the electrical connectivity between the CNT wire and the fixing member 30 was found to be excellent. Further, in the CNT connected structure of the Example, the contact resistance between the CNT wire and the fixing member 30 was less than 0.1Ω, thus proving excellent electroconductivity.

What is claimed is:

1. A connected structure of a substrate and a carbon nanotube wire, comprising:
   the substrate;
   the carbon nanotube wire made of one or more carbon nanotube aggregates each including a plurality of carbon nanotubes, the carbon nanotube wire having an average diameter of 0.05 mm to 3.00 mm;
   a conductive fixing member, part of which is provided between the substrate and the carbon nanotube wire; and
   a conductive member that electrically connects the carbon nanotube wire and the fixing member,
   wherein the conductive member is solder,
   the fixing member includes a base in a substantially plate-like shape, and a needle-like member having a plurality of tips, the needle-like member extending from a surface of the base in the vertical direction and in the direction opposite to the substrate,
   the plurality of tips of the needle-like members protruding beyond the peripheral surface of the carbon nanotube wire is bent so as to contact the peripheral surface of the carbon nanotube wire along a longitudinal direction of the carbon nanotube wire, and
   the needle-like member includes a contact portion in contact with the carbon nanotube wire.

2. The connected structure according to claim 1, wherein:
   the needle-like member includes a penetration portion penetrating the carbon nanotube wire, and
   the carbon nanotube wire and the needle-like member are electrically connected via the penetration portion.

3. The connected structure according to claim 1, wherein the fixing member is an electrode mounted on the substrate.

4. The connected structure according to claim 2, wherein the fixing member is an electrode mounted on the substrate.

5. The connected structure according to claim 1, wherein the needle-like member includes an anchoring portion, the anchoring portion being adapted to anchor the carbon nanotube wire at a portion of the carbon nanotube wire on a side not facing the substrate.

6. The connected structure according to claim 2, wherein the needle-like member includes an anchoring portion, the anchoring portion being adapted to anchor the carbon nanotube wire at a portion of the carbon nanotube wire on a side not facing the substrate.

7. The connected structure according to claim 5, wherein the carbon nanotube wire is subjected to stress from the anchoring portion of the needle-like member.

8. The connected structure according to claim 6, wherein the carbon nanotube wire is subjected to stress from the anchoring portion of the needle-like member.

9. The connected structure according to claim 1, wherein the needle-like member includes a plurality of needle-like members arranged along a longitudinal direction of the carbon nanotube wire located on the fixing member.

10. The connected structure according to claim 2, wherein the needle-like member includes a plurality of needle-like members arranged along a longitudinal direction of the carbon nanotube wire located on the fixing member.

11. The connected structure according to claim 1, wherein the needle-like member includes a plurality of needle-like members arranged along a transverse direction of the carbon nanotube wire located on the fixing member.

12. The connected structure according to claim 2, wherein the needle-like member includes a plurality of needle-like members arranged along a transverse direction of the carbon nanotube wire located on the fixing member.

13. The connected structure according to claim 1, wherein the needle-like member includes a plurality of needle-like members arranged in a diagonal direction with respect to a longitudinal direction of the carbon nanotube wire located on the fixing member.

14. The connected structure according to claim 2, wherein the needle-like member includes a plurality of needle-like members arranged in a diagonal direction with respect to a longitudinal direction of the carbon nanotube wire located on the fixing member.

15. The connected structure according to claim 1, wherein the needle-like member penetrates the carbon nanotube wire along a radial direction of the carbon nanotube wire.

16. The connected structure according to claim 2, wherein the needle-like member penetrates the carbon nanotube wire along a radial direction of the carbon nanotube wire.

17. The connected structure according to claim 1, wherein the plurality of tips of the needle-like member is pointed in different directions.

* * * * *